US005656850A

United States Patent [19]
Kapoor

[11] Patent Number: 5,656,850
[45] Date of Patent: *Aug. 12, 1997

[54] MICROELECTRONIC INTEGRATED CIRCUIT INCLUDING HEXAGONAL SEMICONDUCTOR "AND" GATE DEVICE

[75] Inventor: Ashok Kapoor, Palo Alto, Calif.

[73] Assignee: LSI Logic Corporation, Milpitas, Calif.

[*] Notice: The term of this patent shall not extend beyond the expiration date of Pat. No. 5,539,246.

[21] Appl. No.: 396,542

[22] Filed: Mar. 1, 1995

[51] Int. Cl.⁶ ................................................. H01L 27/118
[52] U.S. Cl. .......................... 257/618; 257/619; 257/146; 257/335; 257/401; 257/909
[58] Field of Search .................... 257/618, 335–343, 257/401, 515, 369, 909, 146, 151, 153, 154, 208

[56] References Cited

U.S. PATENT DOCUMENTS

| | | | |
|---|---|---|---|
| 4,532,534 | 7/1985 | Ford et al. | 257/341 |
| 4,743,950 | 5/1988 | Roggwiller | 257/515 |
| 5,130,767 | 7/1992 | Lidow et al. | 257/341 |
| 5,286,984 | 2/1994 | Nakagawa et al. | 257/212 |
| 5,323,036 | 6/1994 | Neilson et al. | 257/287 |
| 5,406,104 | 4/1995 | Hirota et al. | 257/401 |
| 5,414,290 | 5/1995 | Bauer | 257/401 |
| 5,444,275 | 8/1995 | Kugishima et al. | 257/401 |
| 5,517,041 | 5/1996 | Torii et al. | 257/369 |

OTHER PUBLICATIONS

Chaudhuri, P. Pal, *Routing Multilayer Boards on Steiner Metric*, 1980 IEEE International Symposium on Circuits and Systems Proceedings, vol. 3 of 3, pp. 961–964.

Primary Examiner—Sara W. Crane
Assistant Examiner—Alexander Oscar Williams
Attorney, Agent, or Firm—Oppenheimer Poms Smith

[57] ABSTRACT

A microelectronic integrated circuit includes a semiconductor substrate, and a plurality of microelectronic devices formed on the substrate. Each device has a periphery defined by a hexagon, and includes an active area formed within the periphery. A first terminal and a second terminal are formed in the active area adjacent to edges of the hexagon that are separated by another edge. First to third gates are formed between the first and second terminals, and have gate terminals formed outside the active area adjacent to other edges of the hexagon. The power supply connections to the first and second terminals, the conductivity type (NMOS or PMOS), and the addition of a pull-up or a pull-down resistor is selected for each device to provide a desired AND, NAND, OR or NOR function. The devices are interconnected using three direction routing based on hexagonal geometry.

28 Claims, 5 Drawing Sheets

MICROELECTRONIC INTEGRATED CIRCUIT INCLUDING HEXAGONAL SEMICONDUCTOR "AND" GATE DEVICE

BACKGROUND OF THE INVENTION

1. Field of the Invention

The present invention generally relates to the art of microelectronic integrated circuits, and more specifically to a microelectronic integrated circuit including a plurality of hexagonal semiconductor "AND" gate devices that can be interconnected using three direction routing based on hexagonal geometry.

2. Description of the Related Art

Microelectronic integrated circuits consist of large numbers of semiconductor devices that are fabricated by layering several different materials on a silicon base or wafer. These devices include logic gates that provide AND, OR, NAND, NOR and other binary logic functions. Each device includes a plurality of pins or terminals that are connected to pins of other devices by electrical interconnect wire networks or nets.

As illustrated in FIG. 1, a conventional microelectronic integrated circuit 10 comprises a substrate 12 on which a large number of semiconductor devices are formed. These devices include large functional macroblocks such as indicated at 14 which may be central processing units, input-output devices or the like. A typical integrated circuit further comprises a large number of smaller devices such as logic gates 16 which are arranged in a generally rectangular pattern in the areas of the substrate 12 that are not occupied by macroblocks.

The logic gates 16 have terminals 18 to provide interconnections to other gates 16 on the substrate 12. Interconnections are made via vertical electrical conductors 20 and horizontal electrical conductors 22 that extend between the terminals 18 of the gates 16 in such a manner as to achieve the interconnections required by the netlist of the integrated circuit 10. It will be noted that only a few of the elements 16, 18, 20 and 22 are designated by reference numerals for clarity of illustration.

In conventional integrated circuit design, the electrical conductors 20 and 22 are formed in vertical and horizontal routing channels (not designated) in a rectilinear (Manhattan) pattern. Thus, only two directions for interconnect routing are provided, although several layers of conductors extending in the two orthogonal directions may be provided to increase the space available for routing.

A goal of routing is to minimize the total wirelength of the interconnects, and also to minimize routing congestion. Achievement of this goal is restricted using conventional rectilinear routing because diagonal connections are not possible. A diagonal path between two terminals is shorter than two rectilinear orthogonal paths that would be required to accomplish the same connection.

Another drawback of conventional rectilinear interconnect routing is its sensitivity to parasitic capacitance. Since many conductors run in the same direction in parallel with each other, adjacent conductors form parasitic capacitances that can create signal crosstalk and other undesirable effects.

SUMMARY OF THE INVENTION

In accordance with the present invention, electrical conductors for interconnecting terminals of microelectronic devices of an integrated circuit extend in three directions that are angularly displaced from each other by 60°.

The conductors pass through points defined by centers of closely packed small hexagons superimposed on the substrate such that the conductors extend perpendicular to edges of the hexagons.

The conductors that extend in the three directions can be formed in three different layers, or alternatively the conductors that extend in two or three of the directions can be formed in a single layer as long as they do not cross.

A microelectronic integrated circuit that utilizes the present three direction routing arrangement includes a semiconductor substrate, and a plurality of microelectronic devices that are formed on the substrate in a closely packed hexagonal arrangement that maximizes the space utilization of the circuit.

Each device has a periphery defined by a large hexagon, and includes an active area formed within the periphery.

A first terminal and a second terminal are formed in the active area adjacent to edges of the hexagon that are separated by another edge. First to third gates are formed between the first and second terminals, and have terminals formed outside the active area adjacent to other edges of the hexagon.

The power supply connections to the first and second terminals, the conductivity type (NMOS or PMOS), and the addition of a pull-up or a pull-down resistor is selected for each device to provide a desired AND, NAND, OR or NOR function. The devices are interconnected using three direction routing based on hexagonal geometry.

The present invention substantially reduces the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
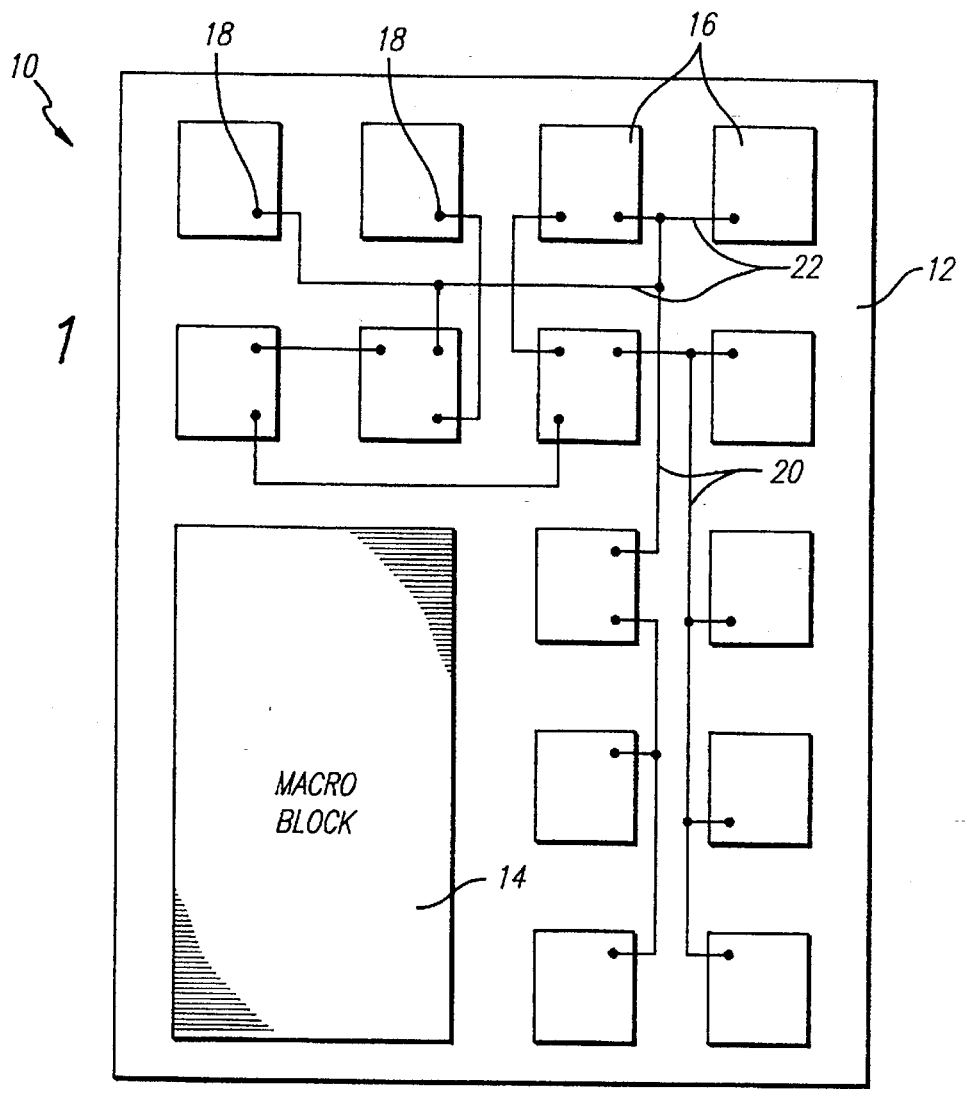
FIG 1 is a diagram illustrating a prior art integrated circuit.
Figure 2:
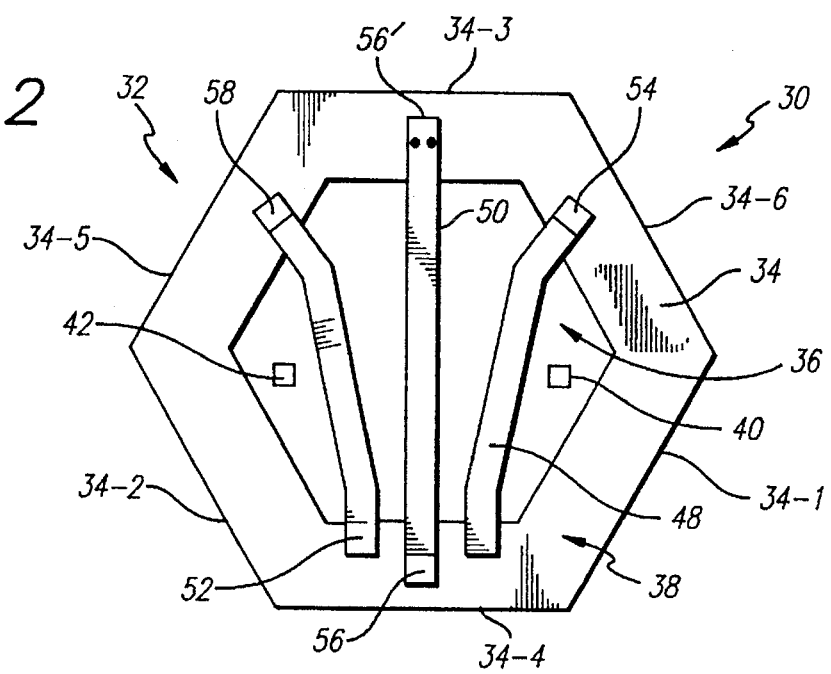
FIG. 2 is a diagram illustrating a microelectronic gate device embodying the present invention.

A semiconductor gate device for a microelectronic integrated circuit is designated by the reference numeral 30 and illustrated in FIG. 2. The device 30, in its basic form, provides a logical AND function, but can be adapted to provide a logical NAND, OR, NOR or other logical function as will be described below.

The gate device 30 is formed on a substrate 32, and has a hexagonal periphery 34 including first to sixth edges 34-1, 34-2, 34-3, 34-4, 34-5 and 34-6 respectively in the illustrated arrangement. A hexagonal semiconductor active area 36 is formed within the periphery 34, and an inactive area 38 is defined between the active area 36 and the periphery 34.

The device 30 comprises an electrically conductive first electrode or terminal 40 which is formed in the active area 36 adjacent to the first edge 34-1 and functions as a Field-Effect-Transistor (FET) source terminal. A second electrode or terminal 42 is formed in the active area 36 adjacent to the second edge 34-2 and functions as an FET drain terminal.

The device 30 further comprises first, second and third gates 48, 50 and 52 that are formed between the first and second terminals 40 and 42. The gates 48, 50 and 52 are preferably insulated gates, each including a layer of insulating oxide with a layer of conductive metal formed over the oxide in a Metal-Oxide-Semiconductor (MOS) configuration.

First to third gate electrodes or terminals 54, 56 and 58 are formed in the inactive area 38 adjacent to the hexagon edges 34-6, 34-4 and 34-5 and are electrically connected to the gates 48, 50 and 52 respectively. It is further within the scope of the invention to alternatively locate the gate electrode 56 adjacent to the edge 34-3 as indicated in broken line and designated as 56'.

In order to provide effective source-drain electrical isolation, the opposite end portions of each of the gates 48, 50 and 52 extend into the inactive area 38.

The device 30 in its most basic form provides a logical AND function. The terminal 40 functions as a source terminal, whereas the terminal 42 functions as a drain terminal of a field effect transistor, with a channel being defined between the terminals 40 and 42.

Each gate 48, 50 and 52 controls the electrical conductivity of a respective underlying portion of the channel such that each gate 48, 50 and 52 can independently inhibit conduction through the channel. Signals must be applied to all of the gates 54, 56 and 58 which cause the underlying portions of the channel to become enhanced in order to enable conduction through the channel. This is an "all" or "AND" configuration.

Figure 3:
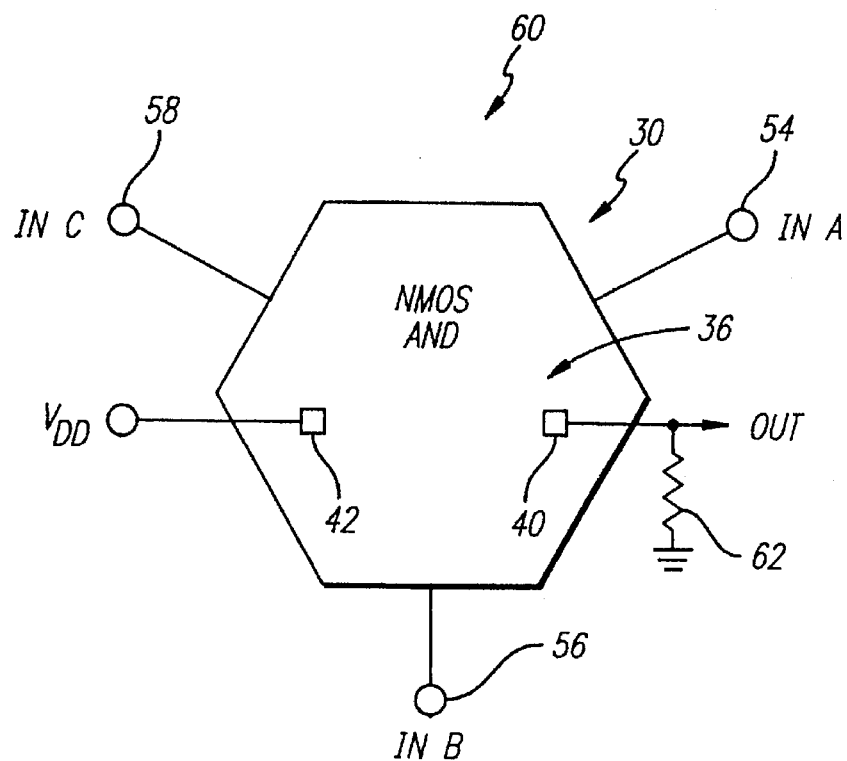
FIG. 3 is an electrical schematic diagram illustrating the present device connected to provide a logical AND function.

An AND gate 60 based on the device 30 is illustrated in FIG. 3. The device 30 is shown in simplified form for clarity of illustration, with only the hexagonal periphery and terminals 40, 42, 54, 56 and 58 included in the drawing. Input signals IN A, IN B and IN C are applied to the gate terminals 54, 56 and 58 respectively, and an output signal OUT is taken at the source terminal 40.

In the AND gate 60 of FIG. 3, the active area 36 of the device 30 is P-type to provide NMOS FET operation. The drain terminal 42 is connected to an electrical potential $V_{DD}$ which is more positive than ground. The terminal 40 is connected to ground through a pull-down resistor 62.

A logically high signal will be assumed to be substantially equal to $V_{DD}$, and a logically low signal will be assumed to be substantially equal to ground. With any logically low input signal IN A, IN B and IN C applied to the gate terminal 54, 56 or 58 respectively, the device 30 will be turned off and the resistor 62 will pull the output low (to ground).

Since the device 30 provides NMOS operation in the configuration of FIG. 3, positive inputs to all of the gate terminals 54, 56 and 58 will establish a conductive channel between the terminals 40 and 42. The entire channel will be enhanced, thereby connecting the source terminal 40 to the potential $V_{DD}$ through the drain terminal 42 to produce a logically high output. In this manner, the AND gate 60 produces a logically high output when all of the inputs are high, and a logically low output when any of the inputs are low.

Figure 4:
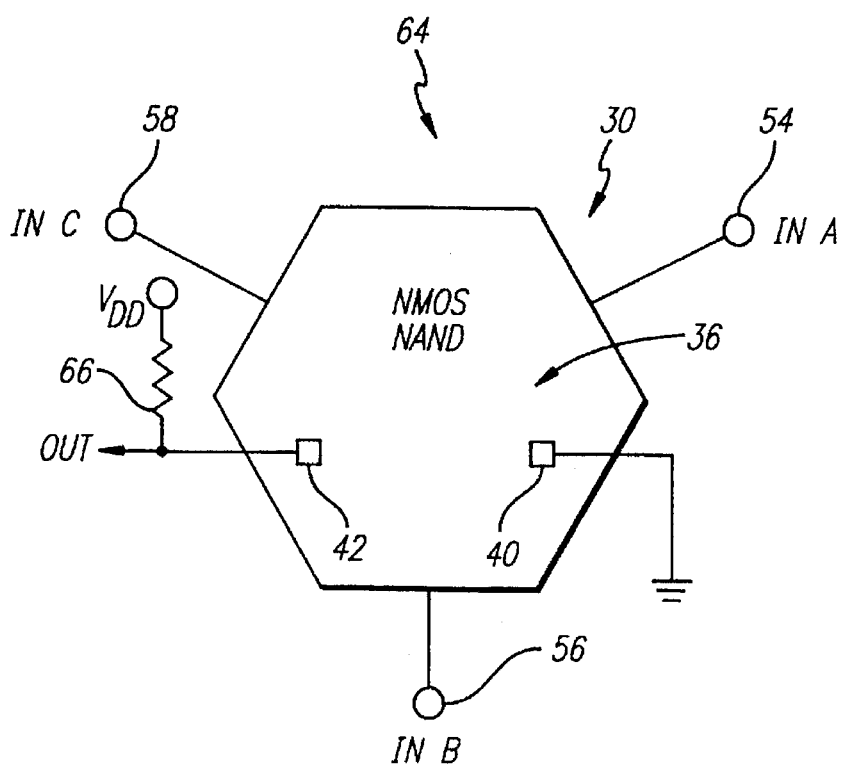
FIG. 4 is an electrical schematic diagram illustrating the gate device connected to provide a logical NAND function.

FIG. 4 illustrates the device 30 connected in circuit to function as a NAND gate 64. In this case also, the active area 36 of the device 30 is P-type to provide NMOS operation. The source terminal 40 is connected to ground, and the drain terminal 42 is connected to $V_{DD}$ through a pull-up resistor 66. The output signal OUT appears at the drain terminal 42.

When any of the inputs are low, the device 30 is turned off and the output will be pulled to $V_{DD}$ by the pull-up resistor 66 to produce a logically high output. If all of the inputs are high, a conductive channel will be established between the terminals 40 and 42 to connect the output to ground and produce a logically low output. In this manner, the output signal OUT will be high if any of the inputs are low, and low if all of the inputs are high to produce the NAND function.

Figure 5:
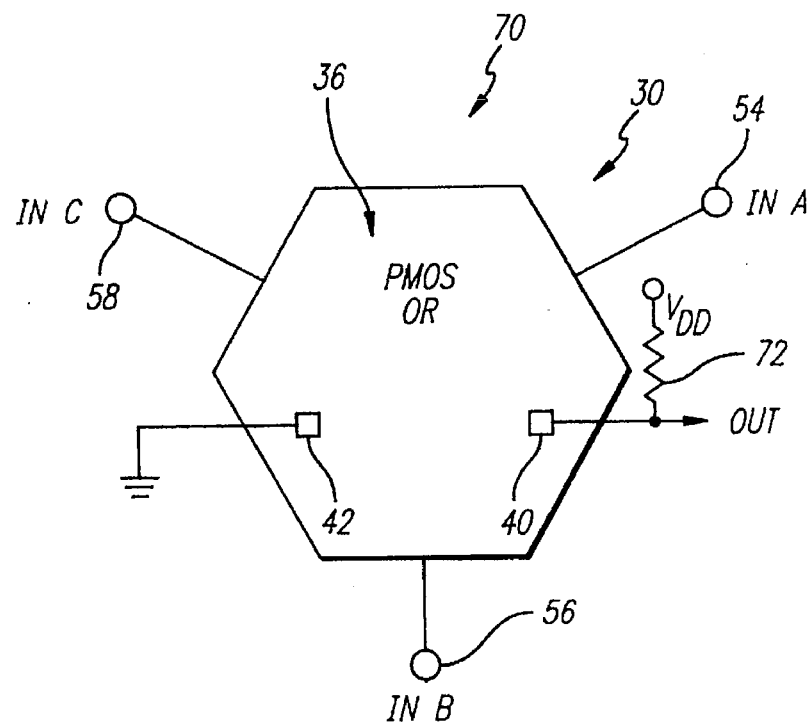
FIG. 5 is an electrical schematic diagram illustrating the gate device connected to provide a logical OR function.

An OR gate 70 incorporating the device 30 is illustrated in FIG. 5. In the OR gate configuration, the active area 36 is N-type to provide PMOS FET operation, and the drain terminal 42 is connected to ground. The source terminal 40 is connected to $V_{DD}$ through a pull-up resistor 72, and the output is taken at the source terminal 40.

Due to the PMOS configuration of the device 30 in the OR gate 70, all of the input signals IN A, IN B or IN C must be logically low to establish a conductive channel between the terminals 40 and 42. This connects the output to ground. Thus, all low inputs will produce a low output.

When any of the inputs is high, the device 30 is turned off, and the output is pulled high by the pull-up resistor 72. Thus, the desired OR function is provided.

Figure 6:
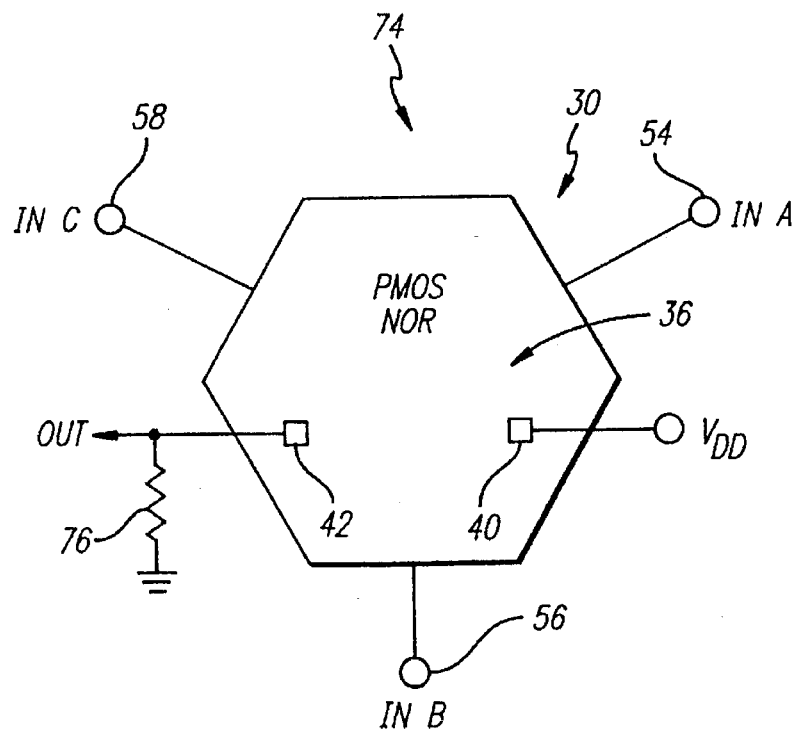
FIG. 6 is an electrical schematic diagram illustrating the gate device connected to provide a logical NOR function.

A NOR gate 74 incorporating the device 30 is illustrated in FIG. 6, in which the active area 36 is N-type to provide PMOS operation. The source terminal 40 is connected to $V_{DD}$, whereas the terminal 42 is connected to ground through a pull-down resistor 76. The output is taken at the terminals 42.

All low inputs will establish a conductive channel between the terminals 40 and 42, thereby connecting the output to $V_{DD}$ and producing a high output. When any of the inputs are high, the device 30 is turned off and the output is pulled to ground by the resistor 76. Thus, the NOR configuration is provided, in which any high input produces a low output, and the output is high in response to all inputs being low.

The device 30 is illustrated as having three inputs, which is ideally suited to the hexagonal device shape. However, it is within the scope of the invention to provide a gate device having one or two inputs. A device with one input can be used as a buffer or an inverter.

The device 30 can be configured without modification to operate as if it had one or two, rather than three inputs. For example, if it is desired to operate the AND gate 60 of FIG. 3 with only two inputs, the gate terminal 58 can be connected to $V_{DD}$ and the two inputs applied to the gate terminals 54 and 56. The OR gate 70 of FIG. 5 can be adapted to provide a two input configuration by connecting the gate terminal 58 to ground and applying the two inputs to the gate terminals 54 and 56.

It is also within the scope of the invention to modify the device 30 to have only one or two inputs by physically omitting one or two of the gates 48, 50 and 52.

Figure 7:
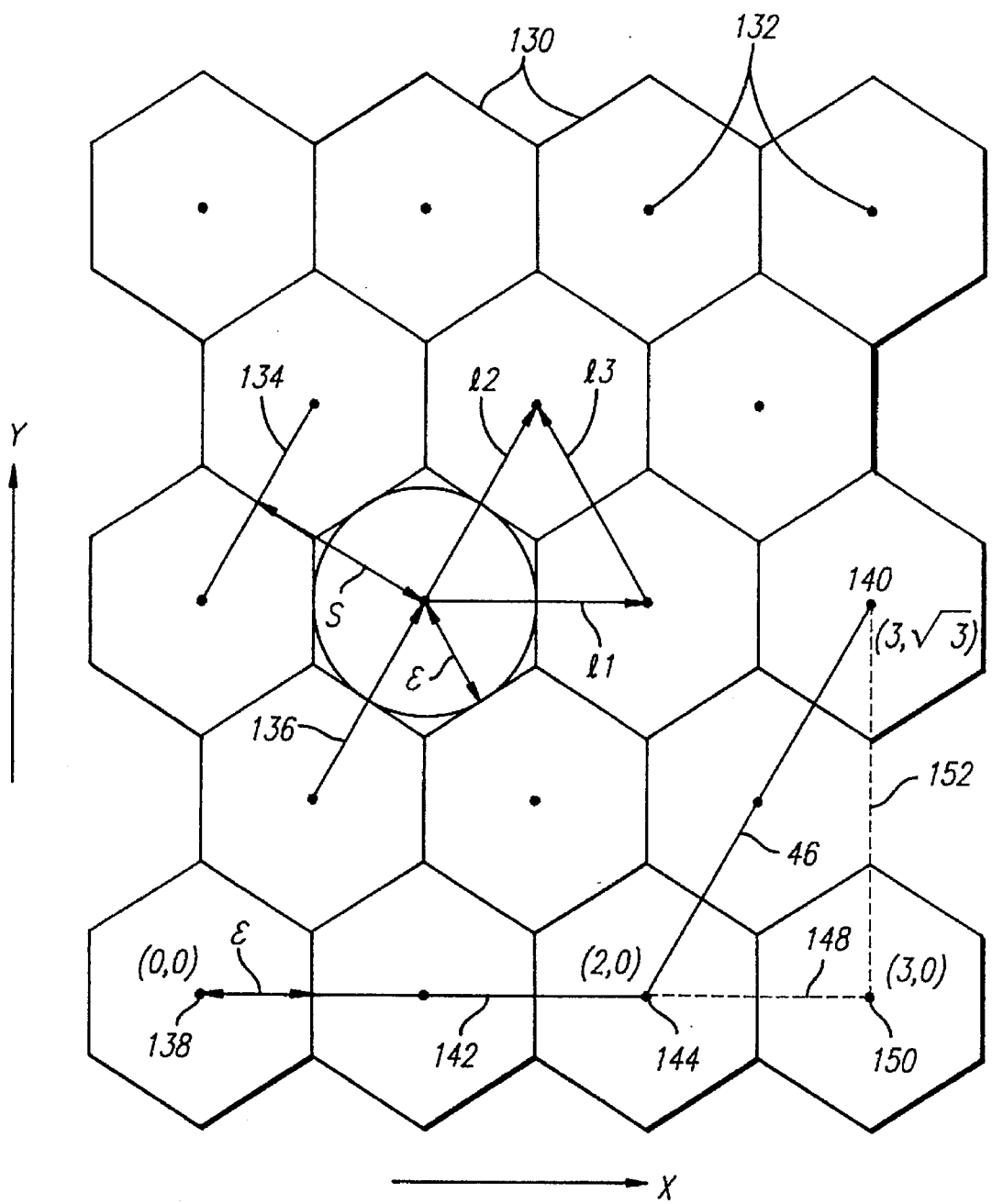
FIG. 7 is a diagram illustrating three direction routing for interconnecting the present devices based on hexagonal geometry in accordance with the present invention.

The geometry of a three directional hexagonal routing arrangement for interconnecting logic gates based on the present device 30 is illustrated in FIG. 7. An orthogonal coordinate system has an X axis and a Y axis. A closely packed pattern of small hexagons 130 is superimposed on the coordinate system, with the centers of the hexagons 130 being designated as terminal points 132.

For the purpose of the present disclosure, the term "closely packed" is construed to mean that the hexagons 130 are formed in a contiguous arrangement with adjacent hexagons 130 sharing common sides as illustrated, with no spaces being provided between adjacent hexagons 130. As will be described in detail below, logic gate devices based on the present device 30 are formed on the substrate 32 in a closely packed arrangement, each logic gate device covering a number of the small hexagons 130.

In accordance with the invention, the centers of the hexagons 130 as indicated at 132 represent interconnect points for terminals of the logic gate devices. Electrical conductors for interconnecting the points 132 extend in three directions that make angles of 60° relative to each other.

The conductors that extend in the three directions can be formed in three different layers, or alternatively the conductors that extend in two or three of the directions can be formed in a single layer as long as they do not cross.

As illustrated, a direction $e_1$ extends parallel to the X axis. A direction $e_2$ is rotated 60 degrees counterclockwise from the direction $e_1$, whereas a direction $e_3$ is rotated 120 degrees counterclockwise from the direction $e_1$. If the directions $e_1$, $e_2$ and $e_3$ are represented by vectors having a common length as illustrated in FIG. 7, they form an equilateral triangle. For convenience, the notation $e_1$, $e_2$ and $e_3$ is used to denote the vectors that extend in the respective routing directions as well as the directions themselves. The radius of the circles that are inscribed by the hexagons 130 is designated as $\epsilon$.

The vectors $e_1$, $e_2$ and $e_3$ can be defined using the following notation.

$$e_1 = (1,0), e_2 = [(1/2), (\sqrt{3}/2)], e_3 = e_1 - e_2.$$

The geometric structure of the present invention can also be defined using set theory. A set $SIX(\alpha,\epsilon)$ of regular hexagons have centers at points $\alpha$, sides that are perpendicular to the vectors $e_1$, $e_2$ and $e_3$, and radii of inscribed circles equal to $\epsilon$ as described above. A set SU of points in a plane is denoted by $x_1 e_1 + x_2 e_2$, where $x_1$ and $x_2$ are integers.

The set $SIX(\alpha,\frac{1}{2})$ for all $\alpha$ from the set SU intersect only on the edges of the hexagons and partition the plane into the closely packed arrangement as illustrated. Circles inscribed in these hexagons are also densely packed.

As further illustrated in FIG. 7, the perpendicular distance S between two adjacent conductors extending in the direction $e_2$, such as conductors 134 and 136, is equal to $S = \sqrt{3}/2 = 0.87$ measured in X-Y coordinates, or $S = \sqrt{3}\epsilon = 1.73\epsilon$. The perpendicular distances between adjacent conductors extending in the other two directions $e_1$ and $e_2$ is the same as for the direction $e_2$.

An advantage of the present hexagonal routing arrangement is that the wirelength of conductors interconnecting two diagonally separated terminals is substantially less than with conventional rectilinear routing. As illustrated in FIG. 7, terminal points 138 and 140 to be interconnected are located at (x,y) coordinates (0,0) and (3,√3) respectively.

Using the present routing arrangement, the points 138 and 140 can be connected by a first conductor 142 extending in the direction $e_1$ from the point 138 to a point 144 at coordinates (2,0), and a second conductor 146 extending from the point 144 in the direction $e_2$ to the point 140. The length of each of the conductors 142 and 146 is 2, and the total connection length is 4.

Using the conventional rectilinear routing method, connection between the points 138 and 140 also requires the conductor 142 from the point 138 to the point 144. However, rather than the diagonal conductor 146, the conventional method requires two conductors, a conductor 148 from the point 144 to a point 150 at coordinates (3,0), and a conductor 152 from the point 150 to the point 140.

The combined length of the conductors 142 and 148 is 3, whereas the length of the conductor 152 is √3. The total length of the conventional rectilinear interconnect path is therefore 3+√3=4.73. The conventional path length between the points 138 and 140 is therefore 18.3% longer than the present path length.

The reduction of 18.3% in pathlength is approximately the average that is attained using the present hexagonal routing arrangement, although individual cases can vary from this value. However, the distance between any two points using rectilinear routing cannot be shorter than that using the present hexagonal routing in any case.

Figure 8:
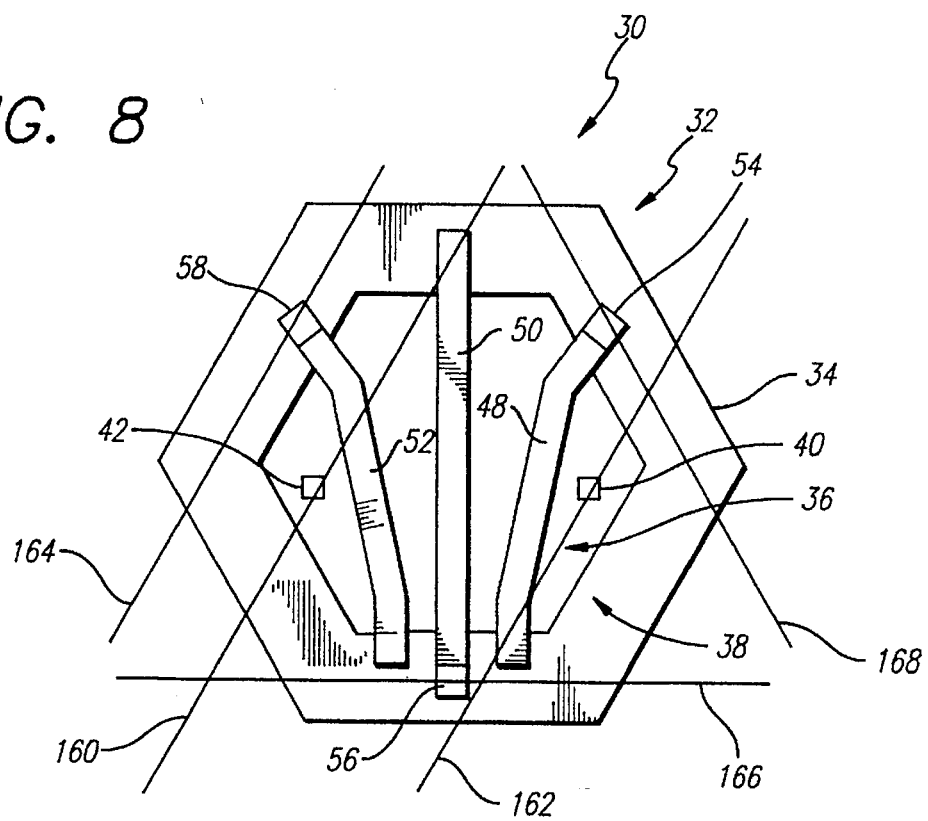
FIG. 8 is a diagram illustrating one device as connected using the three direction routing of FIG. 7.

An example of the device 30 as being interconnected using the hexagonal routing arrangement of FIG. 7 is illustrated in FIG. 8. It will be understood that the particular interconnect directions shown in the drawing are selected arbitrarily for illustrative purposes, and are not in any way limitative of the scope of the invention. In general, any of the wiring directions can be utilized to interconnect any of the elements of the device 30.

In the illustrated example, conductors 160 and 162 that extend in the direction $e_2$ are provided for interconnecting the terminals 42 and 40 respectively. A conductor 164 which also extends in the direction $e_2$ is provided for interconnection of the gate terminal 58 for the input IN C.

A conductor 166 which extends in the direction $e_1$ is provided for interconnection of the gate terminal 56 for the input IN B. A conductor 168 which extends in the direction $e_3$ provides interconnection of the gate terminal 54 for the input IN A.

The conductors 164, 166 and 168 are preferably provided in three separate wiring layers respectively. The conductor 160 is preferably provided in another wiring layer or conductive plane, whereas the conductor 162 is preferably provided in yet another wiring layer or conductive plane.

Figure 9:
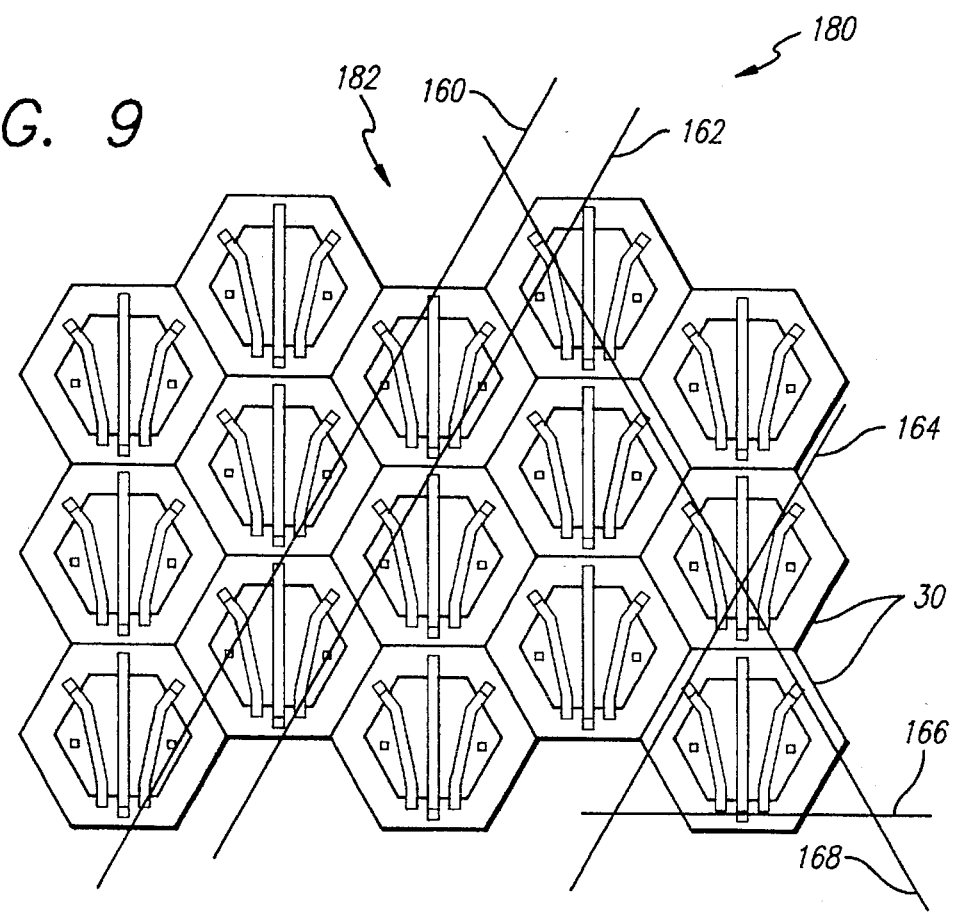
FIG. 9 is a diagram illustrating a microelectronic integrated circuit including a plurality of the present gate devices in a closely packed hexagonal arrangement.

FIG. 9 illustrates a microelectronic integrated circuit 180 according to the present invention comprising a semiconductor substrate 182 on which a plurality of the devices 30 are formed in a closely packed hexagonal arrangement. Further shown are a few illustrative examples of interconnection of the devices using the conductors 160, 162, 164, 166 and 168 that extend in the three directions $e_1$, $e_2$ and $e_3$.

It will be understood from the above description that the present gate device geometry and three direction interconnect arrangement substantially reduce the total wirelength interconnect congestion of the integrated circuit by providing three routing directions, rather than two as in the prior art. The routing directions include, relative to a first direction, two diagonal directions that provide shorter interconnect paths than conventional rectilinear routing.

In addition, the number of conductors that extend parallel to each other is smaller, and the angles between conductors in different layers are larger than in the prior art, thereby reducing parasitic capacitance and other undesirable effects that result from conventional rectilinear routing.

Various modifications will become possible for those skilled in the art after receiving the teachings of the present disclosure without departing from the scope thereof.

For example, it will be understood that the terms "source" and "drain" as applied to field effect transistors merely define opposite ends of a channel region which is controlled by a voltage applied to a gate. The source and drain are interchangeable in that current may flow into either one and out of the other.

Therefore, the terms "source" and "drain", and the relative polarities of voltages applied thereto, as used in the present specification, are arbitrary and reversible within the scope of the invention, and are not to be considered as limiting the invention to one or the other of the possible configurations of polarities.

For example, although not explcitly illustrated, the source terminal 40 and the drain terminal 42 of the device 30 can be reversed relative to each other, with the terminal 40 being used as the drain and the terminal 42 being used as the source. The operation is otherwise the same as described above. This modification is applicable to all embodiments of the invention.

I claim:

1. A microelectronic device formed on a semiconductor substrate, said device defining a hexagon-shaped periphery having first through sixth edges, said device comprising:

an active area formed within said periphery;

a first terminal formed adjacent to said first edge in said active area;

a second terminal formed adjacent to said second edge in said active area;

a first gate formed between the first terminal and the second terminal; and a second gate formed between the first gate and the second terminal.

2. A device as in claim 1, in which said first edge and said second edge are separated by said fourth edge.

3. A device as in claim 1, further comprising:

a third gate formed between the second gate and the second terminal.

4. A device as in claim 3, in which said first edge and said second edge are separated by said fourth edge, said second edge and said third edge are separated by said fifth edge, and said third edge and said first edge are separated by said sixth edge.

5. A device as in claim 4, further comprising an inactive area disposed between said active area and said periphery.

6. A device as in claim 5, further comprising first, second and third gate terminals that are formed in said inactive area adjacent to said fourth, fifth and sixth edges and are connected to the first, second and third gates respectively.

7. A device as in claim 6, in which:

the first terminal constitutes a source terminal; and the second terminal constitutes a drain terminal.

8. A device as in claim 1, further comprising a pull-down resistor, in which:

said active area is N-type;

the first terminal constitutes a source terminal and is connected to a first potential through the pull-down resistor;

the second terminal constitutes a drain terminal and is connected to a second potential which is more positive than said first potential; and the device provides an AND function with inputs applied to the first and second gates and an output taken from the first terminal.

9. A device as in claim 1, further comprising a pull-up resistor, in which:

said active area is N-type;

the first terminal constitutes a source terminal and is connected to a first potential;

the second terminal constitutes a drain terminal and is connected to a second potential which is more positive than said first potential through the pull-up resistor; and the device provides an NAND function with inputs applied to the first and second gates and an output taken from the second terminal.

10. A device as in claim 1, further comprising a pull-up resistor, in which:

said active area is P-type;

the first terminal constitutes a source terminal and is connected to a first potential through the pull-up resistor;

the second terminal constitutes a drain terminal and is connected to a second potential which is more negative than said first potential; and the device provides an OR function with inputs applied to the first and second gates and an output taken from the first terminal.

11. A device as in claim 1, further comprising a pull-down resistor, in which:

said active area is P-type;

the first terminal constitutes a source terminal and is connected to a first potential;

the second terminal constitutes a drain terminal and is connected to a second potential which is more negative than said first potential through the pull-down resistor; and the device provides a NOR function with inputs applied to the first and second gates and an output taken from the second terminal.

12. A device as in claim 1, in which:

the device is a Metal-Oxide-Semiconductor (MOS) device; and the first and second gates each comprise:

an insulating oxide layer formed over the substrate; and a conductive metal layer formed over the oxide layer.

13. A device as in claim 1, further comprising an inactive area disposed between said active area and said periphery, in which the first and second gates each have opposite end portions that extend into said inactive area.

14. A microelectronic integrated circuit, comprising:

a semiconductor substrate;

a plurality of microelectronic devices formed on the substrate, each device defining a hexagon-shaped periphery having first through sixth edges, each device comprising:

an active area formed within said periphery;

a first terminal formed adjacent to said first edge in said active area;

a second terminal formed adjacent to said second edge in said active area; and at least one of the devices further comprising a second gate formed between the first gate and the second terminal.

15. An integrated circuit as in claim 14, in which said first edge and said second edge are separated by said fourth edge.

16. An integrated circuit as in claim 14, in which said at least one of the devices further comprises a third gate formed between the second gate and the second terminal.

17. An integrated circuit as in claim 16, in which said first edge and said second edge are separated by said fourth edge, said second edge and said third edge are separated by said fifth edge, and said third edge and said first edge are separated by said sixth edge.

18. An integrated circuit as in claim 17, in which said at least one of the devices further comprises an inactive area disposed between said active area and said periphery.

19. An integrated circuit as in claim 18, in which said at least one of the devices further comprises first, second and third gate terminals that are formed in said inactive area adjacent to said fourth, fifth and sixth edges and are connected to said first, second and third gates respectively.

20. An integrated circuit as in claim 19, in which:

the first terminal constitutes a source terminal; and the second terminal constitutes a drain terminal.

21. An integrated circuit as in claim 14, in which said at least one of the devices further comprises a pull-down resistor, in which:

said active area is N-type;

the first terminal constitutes a source terminal and is connected to a first potential through the pull-down resistor;

the second terminal constitutes a drain terminal and is connected to a second potential which is more positive than said first potential; and in which said at least one of the devices provides an AND function with inputs applied to the first and second gates and an output taken from the first terminal.

22. An integrated circuit as in claim 14, in which said at least one of the devices further comprises a pull-up resistor, in which:

said active area is N-type;

the first terminal constitutes a source terminal and is connected to a first potential;

the second terminal constitutes a drain terminal and is connected to a second potential which is more positive than said first potential through the pull-up resistor; and in which said at least one of the devices provides an NAND function with inputs applied to the first and second gates and an output taken from the second terminal.

23. An integrated circuit as in claim 14, in which said at least one of the devices further comprises a pull-up resistor, in which:

said active area is P-type;

the first terminal constitutes a source terminal and is connected to a first potential through the pull-up resistor;

the second terminal constitutes a drain terminal and is connected to a second potential which is more negative than said first potential; and in which said at least one of the devices provides an OR function with inputs applied to the first and second gates and an output taken from the first terminal.

24. An integrated circuit as in claim 14, in which said at least one of the devices further comprises a pull-down resistor, in which:

said active area is P-type;

the first terminal constitutes a source terminal and is connected to a first potential;

the second terminal constitutes a drain terminal and is connected to a second potential which is more negative than said first potential through the pull-down resistor; and in which said at least one of the devices provides a NOR function with inputs applied to the first and second gates and an output taken from the second terminal.

25. An integrated circuit as in claim 14, in which:

said at least one of the devices is a Metal-Oxide-Semiconductor (MOS) device; and the first and second gates each comprise:
an insulating oxide layer formed over the substrate; and
a conductive metal layer formed over the oxide layer.

26. A microelectronic integrated circuit, comprising:

a semiconductor substrate;

a plurality of microelectronic devices formed on the substrate, the devices being closely packed on the substrate, each device defining a hexagon-shaped periphery having first through sixth edges, each device comprising:

an active area formed within said periphery;

a first terminal formed adjacent to said first edge in said active area;

a second terminal formed adjacent to said second edge in said active area;

a first gate formed between the first terminal and the second terminal; and interconnect wiring for electrically interconnecting the first terminals, second terminals and first gates of the devices in a predetermined manner, the wiring comprising electrical conductors that extend in three directions that are angularly displaced from each other by 60°.

27. An integrated circuit as in claim 26, in which each of the devices further comprises:

a second gate formed between said first gate and the second terminal; and a third gate formed between the second gate and the second terminal, in which:

said interconnect wiring further comprises electrical conductors for interconnecting the first terminals, second terminals, first gates, second gates and third gates of the devices in said predetermined manner.

28. An integrated circuit as in claim 14, in which each device further comprises an inactive area disposed between said active area and said periphery, in which the first gate has opposite end portions that extend into said inactive area.

* * * * *